United States Patent
Villaret et al.

(10) Patent No.: US 6,957,299 B2
(45) Date of Patent: Oct. 18, 2005

(54) COMBINED CONTENT ADDRESSABLE MEMORIES

(75) Inventors: Yves Emmanuel Villaret, Hadera (IL); Shmuel Prokopets, Bnei Brak (IL)

(73) Assignee: Memcall Inc., New York, NY (US)

( * ) Notice: Subject to any disclaimer, the term of this patent is extended or adjusted under 35 U.S.C. 154(b) by 281 days.

(21) Appl. No.: 10/240,104

(22) PCT Filed: Jan. 30, 2001

(86) PCT No.: PCT/IL01/00088

§ 371 (c)(1),
(2), (4) Date: Mar. 13, 2003

(87) PCT Pub. No.: WO02/061757

PCT Pub. Date: Aug. 8, 2002

(65) Prior Publication Data

US 2003/0182498 A1 Sep. 25, 2003

(51) Int. Cl.[7] ................................................ G06F 12/06
(52) U.S. Cl. ....................................................... 711/108
(58) Field of Search ................................ 711/108, 151, 711/154

(56) References Cited

U.S. PATENT DOCUMENTS

| | | |
|---|---|---|
| 5,010,516 A | 4/1991 | Oates |
| 5,568,416 A | 10/1996 | Kawana et al. |
| 5,805,493 A | 9/1998 | Hiroshi et al. |
| 5,973,950 A | 10/1999 | Shindo |

FOREIGN PATENT DOCUMENTS

WO     WO 01 65564 A     9/2001

*Primary Examiner*—Kevin L. Ellis
(74) *Attorney, Agent, or Firm*—Lowe Hauptman & Berner, LLP

(57) ABSTRACT

A method and circuit for a high speed interface that enables the integration of several Content Addressable memories into a larger, Combined Content Addressable Memory with only an insignificant delay in the original response time of the individual memories. The interface provides connections to the Bus system only and no connection between different CAM devices of the system is needed, whereby the combination of one CAM and one CAM interface in a single device, such as a chip is enabled. Such chips may be used as modules for increasing the CAM Memory by directly attaching them to the Bus System without any additional interface, as known for standard memory chips such as RAM. The inventive interface may also be used for creating a hierarchical structure within a CAM device by dividing the memory cells in groups, each group being interfaced to the larger combined CAM device via an interface according to the invention. In such a structure the priority function in each group operates on a smaller number of cells and due to the relatively small number of gates necessary for making the interface the implementation of a CAM device with a reduced number of gates is facilitated. In a combined CAM device several CAMs are connected to an Address Bus and to a Data Bus via their respective interfaces. In the Read and Write mode, the interface will connect the two sets of lines and thus be transparent for the Read or Write operation. In the search mode (Content Addressing mode), the Interface will select and set a number of lines of the Data Bus according to the CAM response so as to output the address of one matching cell that is the highest in a predefined direction. The interface circuit adds the logic functions and lines necessary to expand the Content addressable functions of the CAM module to a larger range of addresses, sets an additional number of bus lines in order to write the address of the cell within that larger range and checks that no other cell with a higher address responds throughout the system by masking the bits of the CAM address if they would change the address of a cell with a higher address. In this way the whole ensemble of CAMs is capable of functioning as a single CAM of larger size.

11 Claims, 6 Drawing Sheets

COMBINED CONTENT ADDRESSABLE MEMORIES

FIELD OF THE INVENTION

The present invention relates to a method and circuit for a high-speed interface that enables the integration of several Content Addressable Memories into a larger, Combined Content Addressable Memory.

In the framework of the invention, the term Content Addressable Memory (CAM) will generally refer to a memory device having, in addition to the normal Store and Retrieve functions of a memory, a content addressing function the operation of which may be described as follows:

When a Content Addressable Memory device is placed in the Content Addressing mode, a given value is set on a number of Bus Interface lines, and the device responds by setting on another set of Bus Interface lines data representing the position of one memory cell. That cell, designated hereinbelow the Responding Cell, has stored data verifying a predefined relationship with the data presented on the first Bus Interface Lines (hereinbelow designated Matching Data). In some types of CAMs, the first and second set of Bus Interface Lines may be the same physical lines, used in both the above phases of the operating cycle. The first and second set of Bus Interface Lines will be designated hereinbelow Address Bus and Data Bus.

Memory devices of the above type are described for example in patents U.S. Pat. Nos. 4,805,093, 5,502,832 and 5,568,416.

In the framework of the present invention, CAM will also refer to Call Out Memories of the types described in Patents PCT/IL 00/00121 and PCT/IL 00/00327. Call Out Memories may also have a "Range" function defining an address value for which the term "Origin Address" will be used. The Origin Address may be transferred as an input to the Call Out Memory.

In the content addressing mode this Origin Address defines a starting position for the search function, in a given direction, and the search may be defined so that the Address Output of a Call Out Memory is the biggest, but smaller than the Origin Address, in a predefined direction, among all Memory Cells having matching data. In case of Call Out Memories the Content Addressable mode is also referred to as Call Out mode.

Existing CAM devices have limited capacity, due to the large number of gates necessary to implement them. As a result, where a large Content Addressable Memory space is needed, a plurality of CAM devices must be used. However merging many CAMs into a larger Content Addressable Memory requires dedicated interface or connections. Such interface circuit will in turn cause delays, resulting in a longer response (search) time for the overall Content Addressable Memory.

Various methods have been proposed for cascading CAMs in a modular way (WO99/23662, U.S. Pat. No. 5,930,359), however these methods imply a degradation in response time. Thus for example in the case of U.S. Pat. No. 5,930,359 the searched result is pipelined through all the CAMs, thereby causing a potential delay in the final response, to be multiplied by the number of CAMs. In WO99/2362 an improved system is shown, in which only a logical signal is passed from CAM to CAM, thus resulting in a delay equal to elementary gate delay multiplied by the number of CAMs.

In both cases, the integration of several CAMs in a single large Content Addressable Memory causes degradation in response time of the memory.

Another disadvantage of these integrating methods is that the parallel architecture of the Bus System is violated because interconnections between different CAM devices must be provided. This in turn degrades system modularity and expandability.

It is therefore desirable to design a modular interface for a CAM device that does not add delay and at the same time preserves the parallel architecture of the BUS system. It is further desirable to design a modular interface for a CAM device that is integrally constructed with the CAM device such that the combined CAM and interface may be applied as a modular unit for fast and simple enlargement of an existing memory without the need for the addition of further circuitry.

It is also desirable to design a modular interface for a CAM device that enables the construction of large and complex CAM devices while reducing the number of logic gates and the amount of wiring necessary for such structures.

SUMMARY OF THE INVENTION

A method and circuit for a high speed interface that enables the integration of several Content Addressable memories into a larger, Combined Content Addressable Memory with only an insignificant delay in the original response time of the individual memories.

The novel interface provides connections to the Bus system only and no connection between different CAM devices of the system is needed, whereby the combination of one CAM and one CAM interface in a single device, such as a chip is enabled. Such chips may be used as modules for increasing the CAM Memory by directly attaching them to the Bus System without any additional interface, as known for standard memory chips such as RAM.

The inventive interface may also be used for creating a hierarchical structure within a CAM device by dividing the memory cells in groups, each group being interfaced to the larger combined CAM device via an interface according to the invention. In such a structure the priority function in each group operates on a smaller number of cells and due to the relatively small number of gates necessary for making the interface the implementation of a CAM device with a reduced number of gates is facilitated.

In a combined CAM device several CAMs are connected to an Address Bus and to a Data Bus via their respective interfaces. In the Read and Write mode, the interface will connect the two sets of lines and thus be transparent for the Read or Write operation. In the search mode (Content Addressing Mode), the Interface will select and set a number of lines of the Data Bus according to the CAM response so as to output the address of one matching cell that is the highest in a predefined direction. The interface circuit adds the logic functions and lines necessary to expand the Content addressable functions of the CAM to a larger range of addresses, sets an additional number of bus lines in order to write the address of the cell within that larger range and checks that no other cell with a higher address responds throughout the system by masking the bits of the CAM address if they would change the address of a cell with a higher address. In this way the whole ensemble of CAMs is capable of functioning as a single CAM of larger size.

DETAILED DESCRIPTION OF THE PREFERRED EMBODIMENT

Figure 1:
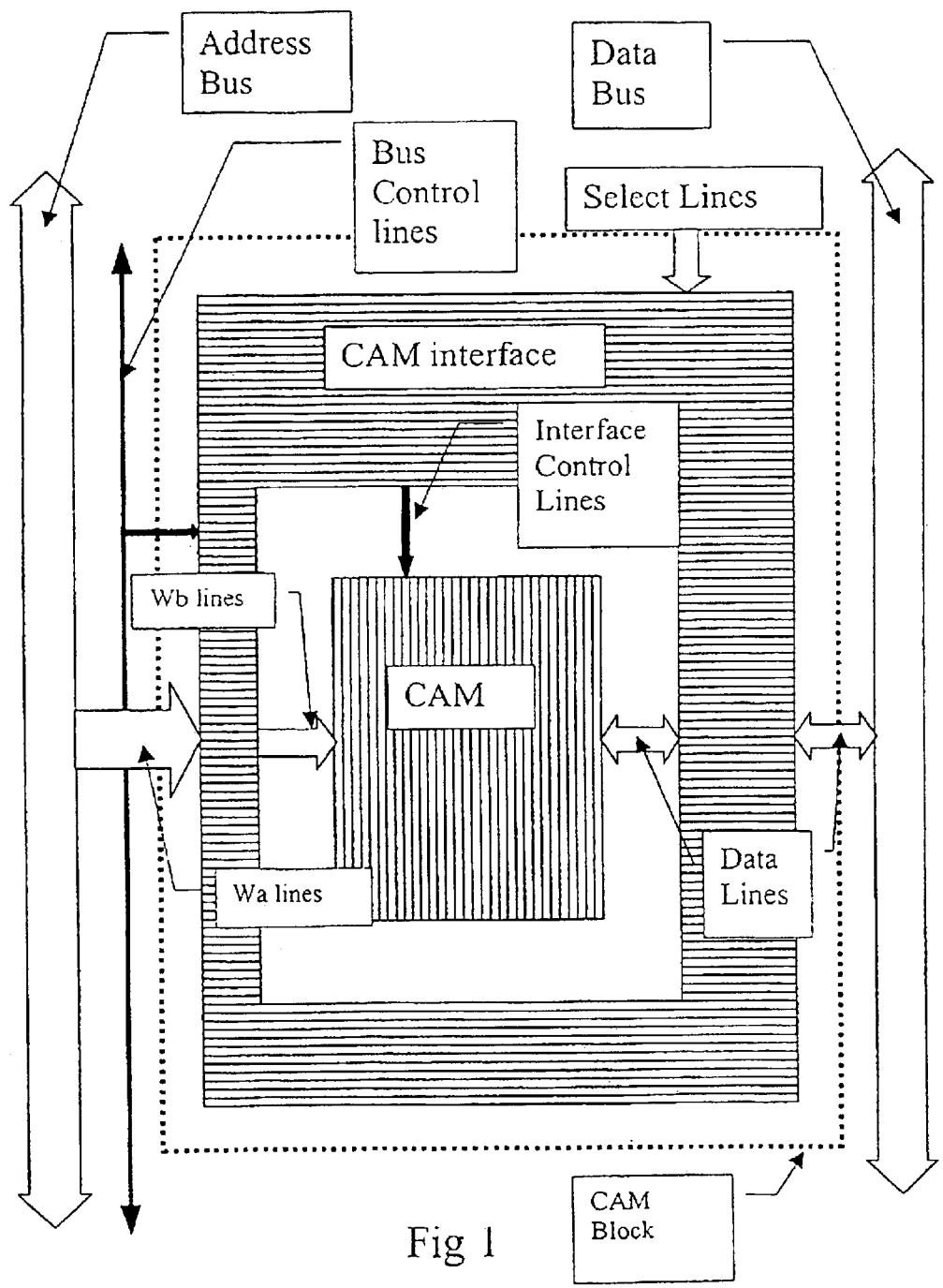
FIG. 1 shows the general arrangement of an Interface for a CAM device according to the invention.

It is the object of the present invention to provide a high speed interface that enables the integration of several Content Addressable Memories into a larger, Combined Content Addressable Memory. In accordance with the inventive method and circuitry, the new interface provides connections to the BUS system only, and no connection between different CAMs within the same system is needed. The inventive interface is advantageous in that the delay added by the interface is very small, and not dependent on the number of CAMs installed. Thus the novel interface integrates all installed CAMs in one Content Addressable Memory of larger size, having a response time almost equal to that of a single CAM device.

The inventive interface may also be used to interconnect memories of the Call Out type. These memories are designed to operate in either a R/W mode or a Call Out mode. A Call Out Memory comprises a Range Circuit and when in the Call Out Mode, it will output on the Bus the Address of a Matching Cell with the highest value in a predefined direction but lower than an Origin Address. Such memories have been described in PCT/IL00/00121 and PCT/IL00/00327.

The following example may best demonstrate the interface of the invention. Where an available CAM device comprises $2^{W1}$ elementary cells, each cell capable of storing Wd bits, the novel interface will provide means to integrate up to $2^{W2}$ identical CAMs in order to create a CAM memory comprising $2^{W1+W2}$ cells. In this example, all the CAM devices have the same size, i.e. the same number of cells, but the invention can also provide interface for several CAM devices, of different sizes.

It is an advantage of the invention that the resulting larger Content Addressable Memory array will function at almost the same speed as each individual CAM. Only a minimum delay is added.

In accordance with a further advantageous feature of the inventive method and circuit, the interface designed according to the invention will provide a modular interface, having connections to the CAM module and the Bus System only, i.e. no connection to the other CAMs of the system is needed. This feature makes possible the combination of one CAM and one CAM Interface in a single device, such as a chip. Several devices or chips of that type may then be directly used in the Bus System, without any additional interface, in the same way known for the addition of several standard memory chips (for example Random Access Memory) to a Bus System to form a larger memory.

It is yet another advantageous feature of the invention that an interface designed according to the invention can be used to create a hierarchical structure within a CAM group being interfaced to the larger CAM device by means of an interface according to the invention. Using such architecture, the number of logic gates needed to implement the CAM can be reduced, because the priority function in each group operates on a smaller number of cells. The number of gates necessary to make the interface is relatively small, since only one such interface needs to be provided for all the cells in one group. Due to the above enumerated advantages of the invention, the implementation of a CAM device with a reduced number of gates is facilitated.

Where the Interface of this invention is used to interface Call Out memories, an Origin Address interface is also provided. The interface will receive an Origin Address from the System Bus, and will enable the CAM only if at least one cell of the CAM has a lower address (in a predefined direction) than the Origin Address.

The invention will be described hereinbelow in respect of a preferred embodiment. It will be understood however that many variations and modifications of the inventive interface and circuit may be made that still remain in the scope of the invention as described and claimed herein.

Referring to FIG. 1, a CAM memory is shown with an Interface according to the invention. The Interface is connected to the Address Bus via a number Wa of Address lines. The CAM is connected to the Interface via a number Wb of Address Lines, Wb being smaller or equal to Wa. The number of lines Wb is the number of address lines needed for the operation of the CAM device, according to its specifications.

The Interface is also connected to a Data Bus on one side, and to the CAM device bus lines on the other side. During the Reading or Writing of values from or to the CAM device, the Interface will connect the two sets of BUS lines, and will thus be transparent for the Read or Write operation. When functioning in the search mode (Content Addressing mode), the Interface will select and set a number of lines of the Data Bus, according to the CAM response, in order to output on the Data Bus a value representing the position (Address) of one matching cell of the CAM, provided that this matching cell of the CAM is the one having the Highest address in a predefined direction, among all cells of all CAMs present in the system.

A number of Select Lines are connected to the interface, used to define the specific position of the CAM and CAM Interface in the total address space of the Bus System. Such Select Lines are commonly used in Bus Systems to define the position of a device having a restricted address space. Typically the Select Lines will be fixed to predefined logic levels, thus defining the address range of the CAM cells in the total memory range of the system.

An additional set of Control Lines of the System Bus, is also connected to the interface, and from the interface to the CAM device. The Control Lines from the System Bus to the interface are designated in FIG. 1 Bus Control Lines and the Control Lines from the interface to the CAM device are designated Interface Control Lines. Such control lines, carrying the signals required for the implementation of the Bus protocol, are of common use in Bus systems.

A CAM that is installed within a larger CAM device and connected via the inventive CAM interface will be designated herein a CAM module.

The purpose of the interface circuit is to add the logic functions and lines necessary to expand the Content Addressable functions of the CAM module to a larger range of addresses. The CAM module, having been designed for a limited size, is able to output the address of one of its Responding Cells with a smaller number of bits than the number of bits necessary to define an address in the whole system. Upon integrating the CAM module in a larger Content Addressable Memory, it becomes necessary to set an additional number of Bus lines in order to write the address. Furthermore, it will be necessary to check, before the Address is put out, that no other cell with a higher address responds throughout the system. The CAM Interface will then a)__set the additional Bus Lines in order to write the extended Responding Cell Address, b)__mask the bits of that Address if they would change the Address of a responding cell with a Higher Address.

For example, a large CAM array may be designed by integrating several CAM devices, each containing $2^{w1}$ cells. Each of these CAM devices will put out w1 lines to set the Address Value of their respective single matching cells. The larger system, formed by a number $2^{w2}$ of CAM devices will require w1+w2 lines to put out Address values. The role of the interface will then be to interface the w1 lines of the CAM and appropriately set the w2 lines connected to the Data Bus such that the whole ensemble of CAM modules will function as a single CAM of larger size.

Figure 2:
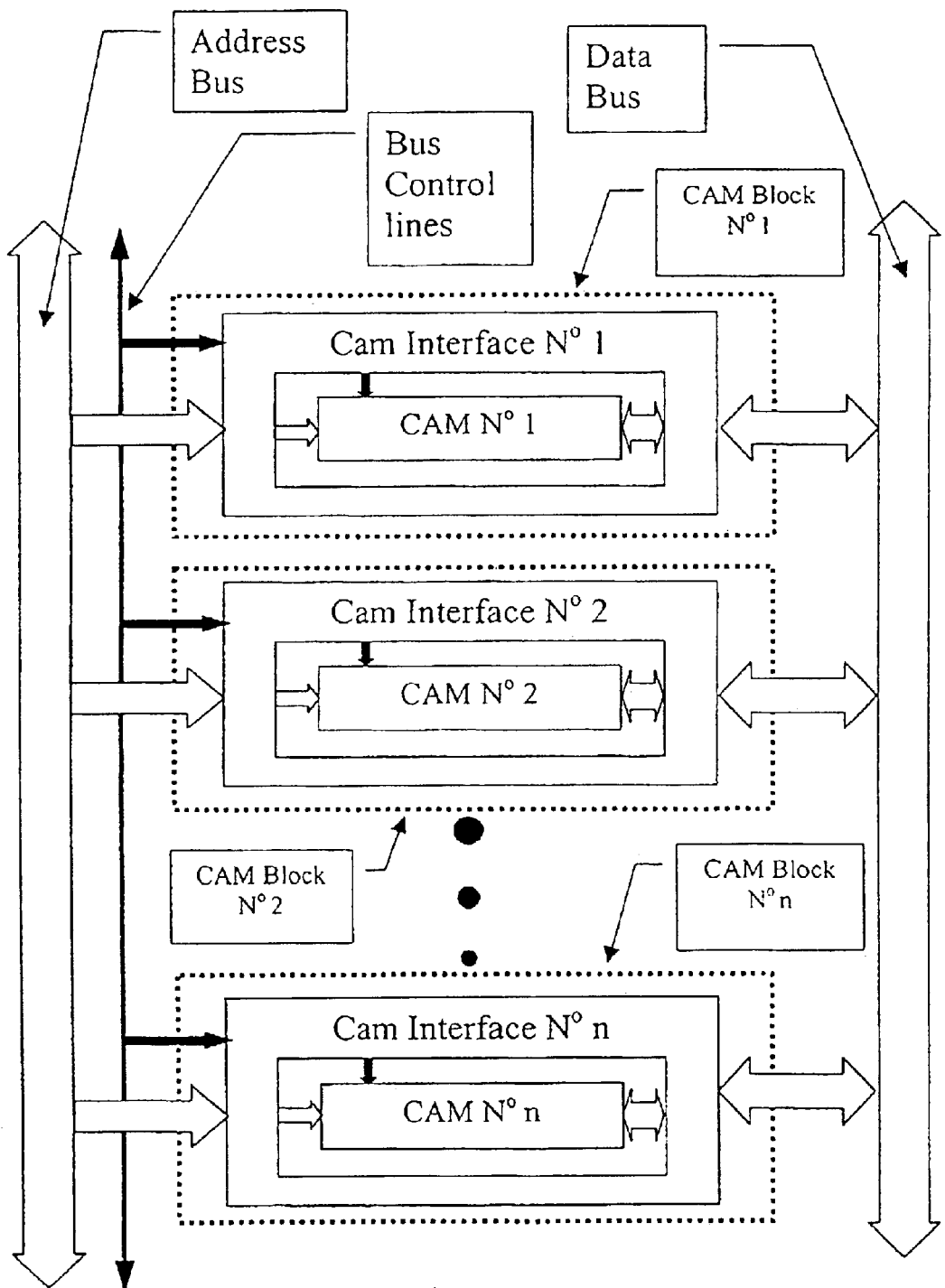
FIG. 2 shows how several CAMs can be integrated in one larger CAM by coupling each CAM with a CAM interface of the invention.

In FIG. 2, it is shown how several CAM devices can be integrated to form one larger Content Addressable Memory. CAMs and CAM Interfaces are grouped in elementary CAM blocks, each elementary CAM block consisting of a CAM module and a CAM Interface. No interconnections between elementary CAM blocks are necessary; each elementary CAM block is connected to the system BUS only. This illustrates the advantage of the inventive CAM interface over the prior art.

With CAMs of the prior art, in order to cascade several CAM modules within a larger CAM array, interconnections between the CAM modules are necessary. As a result, it is not possible to enlarge a CAM array in a modular way.

By connecting a CAM device to a CAM Interface in accordance with the novel design of the present invention, several CAM modules can be modularly aggregated to form a larger CAM array. This is done in the same way that several common memory devices, such as RAM, are added to a Bus System, without adding or changing any of the corrections within the BUS System.

If for example, the CAM Interface is implemented integrally with the CAM device (for example in the same chip), then a new CAM element is obtained, that has the same modularity as standard memory devices, for example RAM.

Figure 3:
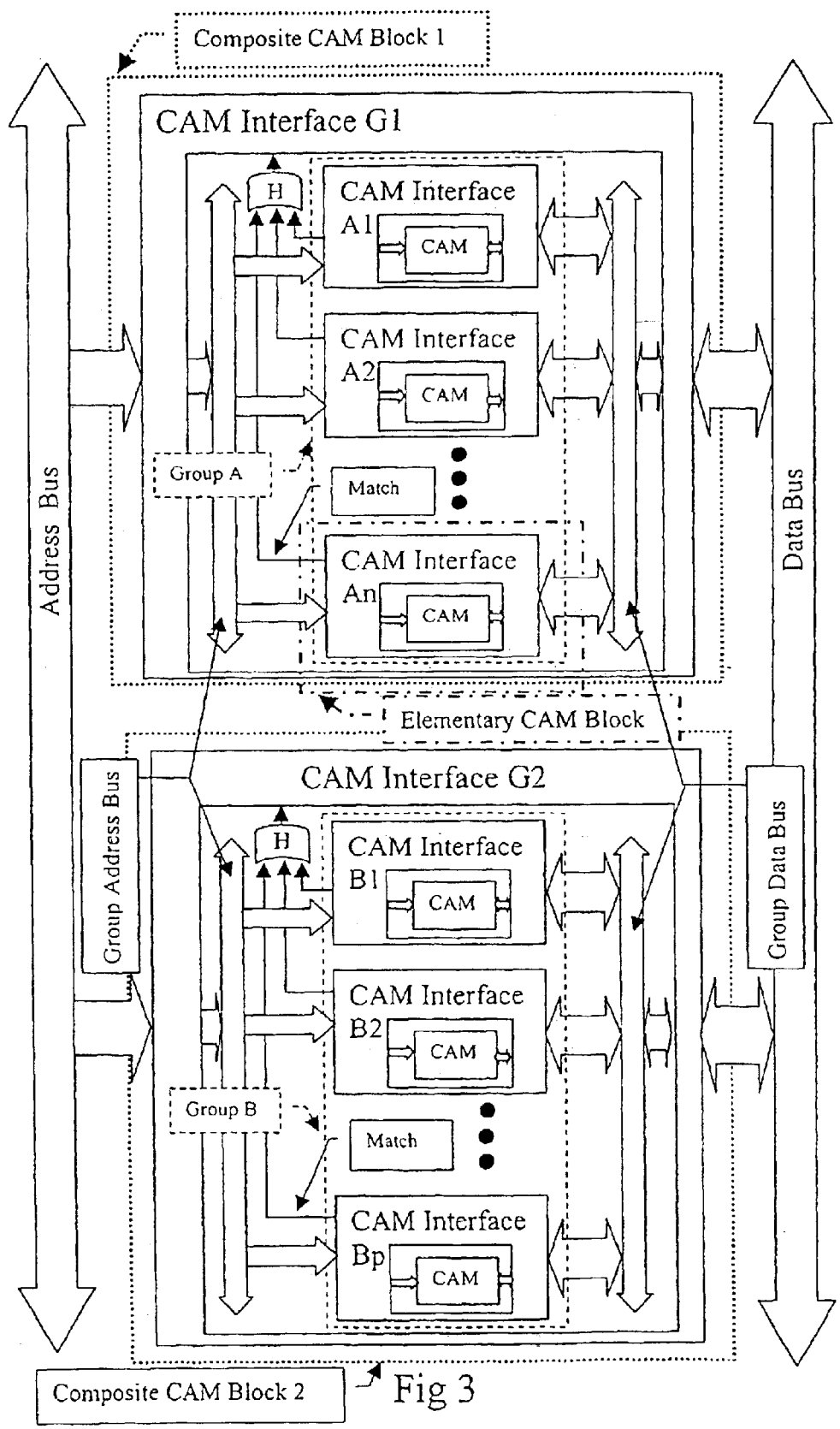
FIG. 3 shows how several CAMs can be grouped to form larger CAMs, these CAM groups also being interfaced according to the invention, thus forming a still larger CAM memory.

In FIG. 3, a hierarchical organization is shown of CAMs and CAM Interfaces that can be used to create a large CAM. Each of the individual elementary CAM blocks A1, A2, An is designed for a reduced address space, so that the number of bits required to describe the address is reduced, and the number of logic gates used is also reduced. These individual CAMs are then connected in two groups A and B by means of CAM Interfaces (A1 to An for group A, B1 to Bn for group B) that interface the said CAMs to Group Buses A and B respectively whereby two larger CAMs are achieved. These two larger CAMs are then connected to the System Bus by means of two additional CAM Interfaces G1 and G2 and the two composite CAM blocks each comprising one of the said larger CAMs and one of the Interfaces G1 and G2 are combined into a CAM of even greater size. Though this example shows only two Composite CAM Blocks, it must be understood that any number of Blocks may be used, and the same principle operates in the reverse direction, i.e. every sub-group may contain several smaller sub-groups, and so on. Such a hierarchical architecture can be used within one device (such as a chip) to achieve a large size CAM.

For the purpose of this hierarchical organization, an additional output is provided at each CAM interface. This output (match) is activated if at least one memory cell of the interface CAM is found matching.

In case that several CAM modules are gathered in one group in order to be interfaced to a CAM interface at a higher hierarchy, an OR function, designated H in FIG. 3, is applied to all these Match lines. The output of that OR is then connected to the CAM interface that is higher in hierarchy. This signal is then used to selectively activate the Higher hierarchy Interface if at least one cell among all cells interfaced in the lower hierarchical group is matching.

Figure 4:
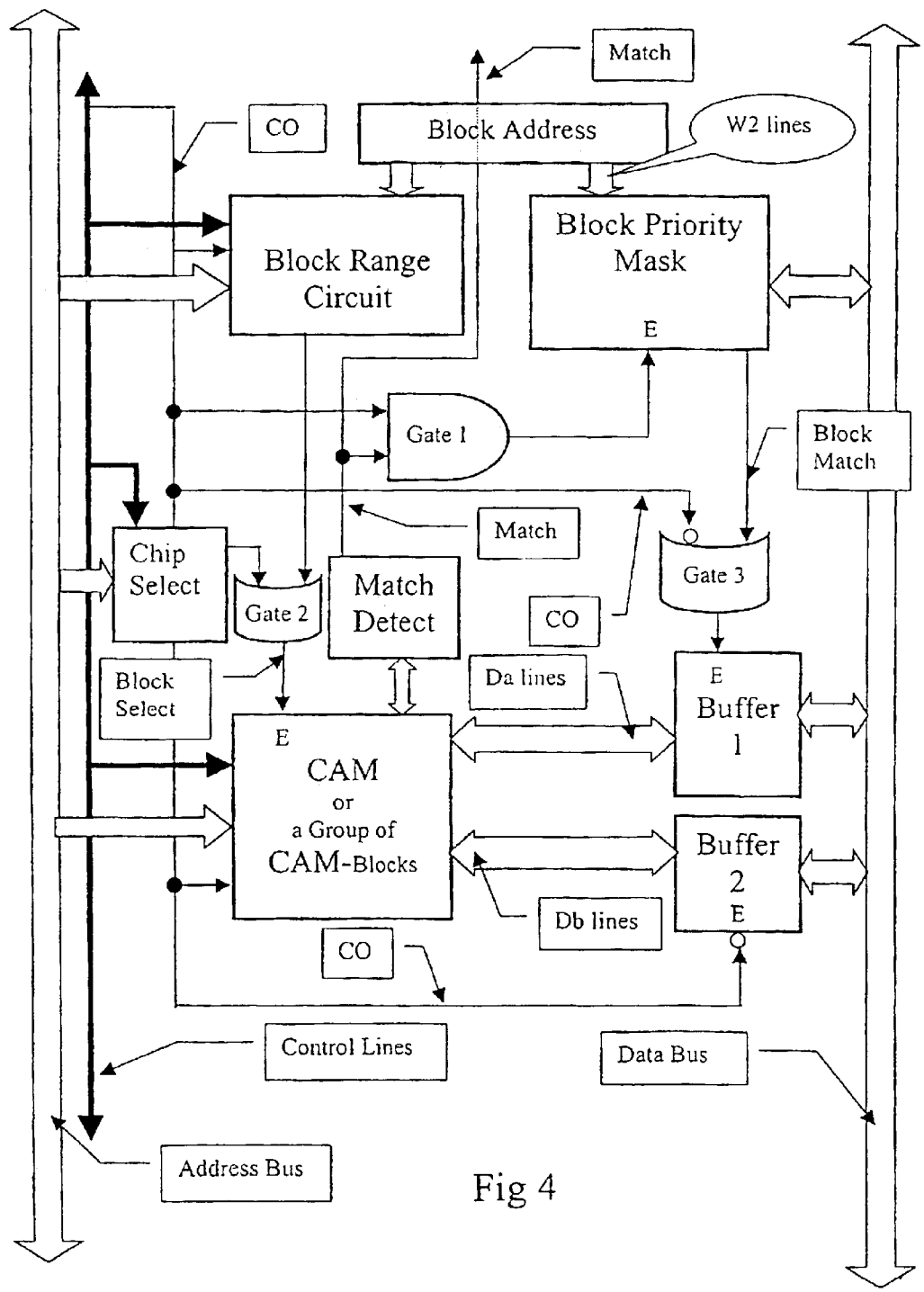
FIG. 4 shows the components of a CAM interface according to the invention.

In FIG. 4, a block diagram of a preferred embodiment for a CAM Interface that is designed for a Call Out Memory is shown, comprising the following components:

a) Chip Select: a logic circuit commonly used in Bus Systems that enables a device to be activated. In the inventive interface the Chip Select is used in the Normal Mode, in order to activate the CAM for read or write operation.

b) Block Range Circuit: The Range Circuit is a comparator circuit that compares, when the interface is in the Content Addressing mode, the data set on the Address Bus lines to the Data set on the Select Lines. If the first one is smaller or equal, in a predefined direction, then the Block Select signal is issued, that enables the CAM device. A Control line (CO) is also input to the CAM for selectively operating the CAM in the Content Addressing mode.

c) CAM device:

In the scope of this invention, a CAM device will generally designate a memory device having, in addition to the normal Store and Retrieve Functions of a memory, a content addressing function, described as follows:

When a CAM device is placed in the Content Addressing mode, a given value is set on a number of Bus Interface lines, and the device responds by setting on another set of Bus lines data representing the position of one memory cell. That cell, designated herein as the Responding Cell, has stored data verifying a predefined relationship with the data presented on the first Bus Lines, designated herein as Matching Data.

Data is defined herein as the number of bits necessary to make a binary representation of the address of a cell inside the CAM device.

The CAM Interface receives W2 select lines, that define a base address for all cells of the CAM. The address of a cell of the CAM in the whole system will then be a binary number with Da least significant bits, and W2 most significant bits.

The CAM device receives as inputs the R/W signal to select between normal Read and Write mode, and the CO line to select between Normal and Call Out mode. Additional control lines commonly used in memory devices are also input to the CAM to enable its normal function. The CAM is enabled by the Chip Select when in normal mode, or by the Range Circuit in the Call Out mode.

In normal Read or Write operation, Da+Db Data bus lines are connected to the CAM device through a pair of buffers. Da+Db is the (maximum) number of bits used by the CAM for Read or Write operation.

In the Call Out mode, only Da lines are buffered to the Data Bus, and used to set a partial Address of the responding cell on the Data Bus. This partial address is the Address of the responding cell in the CAM device. The Block Priority Mask will then set the rest of the Address, according to the W2 select lines, that represents the position of the CAM device in the total memory system. We shall further refer to the data set on these W2 lines as the Block Address.

d) Block Priority Mask:

Addresses containing the same W2 most significant bits of the W2 lines (Block Address) are allocated to all the cells within a CAM device.

The Block Priority Mask is designed to set these W2 most significant bits if one cell of the CAM is responding, while masking the set bits of any other Address that would change the Address set on the Bus, if the Address set on the Bus has a bigger value.

To implement this function, the Block Priority mask receives as input the Data Bus lines and the W2 Select lines. By means of a logic function on these inputs, the Block Priority Mask will enable for output only bits of the Block Address that would not change an address of a higher value than its own Block Address.

The Block Priority mask is enabled if the Call Out mode is activated and one of the CAM cells is responding. If the Block Priority Mask does not detect on the Data Bus any address higher than its own Block Address, then it will output the enabling signal to the first buffer that will then allow the Address of the responding cell to be put out on the Data Bus.

e) a Match Detect circuit, which may be a part of the CAM or a logic circuit added to the CAM. Most CAM devices provide a Match detection output. This output is activated if at least one cell of the CAM is responding. In the present embodiment, this output is used to enable the Block Priority mask.

f) a Gate arrangement (Gate 1) that performs the following functions:

_enable the Block Priority Mask only in the Content Addressing mode.

_enable the Block Priority Mask only in the event that one cell has matching data.

g) Buffers 1 and 2

Buffer 1 is used to connect or isolate Da lines of the data bus from the CAM. This Buffer receives an enabling signal from an "OR" gate, (gate 3). When the enabling signal is issued, the Buffer performs a connection between Da Data Bus lines and the CAM bus lines.

Buffer 2 is used to connect or isolate D1b lines of the data bus from the CAM. It receives CO as a disabling signal. When CO is active, Buffer 2 isolates Db lines of the CAM from the Data Bus.

If the CAM alone were connected to the Bus system, then Da+Db lines of the CAM would be connected to the Data Bus. In the read or write mode, these lines would be used to transfer the data to be retrieved or stored.

Where the CAM is combined with the inventive CAM Interface, in normal Read/Write mode (CO signal not active), all of the Data Bus lines need to be connected to the memory cells to perform the usual Read/Write operations. Buffers 1 and 2 of the CAM Interface will then be activated to connect the Data Bus lines to the CAM. Referring to FIG. 4, it will be observed that the CO signal is input to an "OR" gate (gate 3), that outputs an enabling signal to Buffer 1 if CO is not activated. It is further shown in FIG. 4 that the signal CO is directly input to Buffer 2, enabling that buffer if CO is not activated.

In Call Out mode, the CAM sets the address of the responding cell on a restricted number Da of lines. Db lines of the CAM are then not used. These lines are disconnected from the Data Bus by Buffer 2.

If one cell of the CAM is responding, then the CAM will set the address of the CAM on Da lines, and the Block Priority Mask will be activated. The Block Priority mask will set the Block Address on the Data Bus on the W2 lines, and this in case that there is no other responding cell at a higher address. In that case the Block Priority Mask will also output an enabling signal to Buffer 1, thus allowing the CAM to output the address of the responding cell on the Da least significant bits.

If the Block Priority Mask detects that an address with higher value than its own address has been set on the Data Bus, then it will not output the enabling signal to Buffer 1, so that the CAM will stay isolated from the Data Bus.

It will be understood that the single CAM shown in FIG. 4 may be replaced by a unit of higher complexity such as an Elementary CAM block or a Composite CAM block as described in reference to FIG. 2 and the inventive interface may enable the read and write and call out functions in respect of that complex unit in a similar manner.

Figure 5:
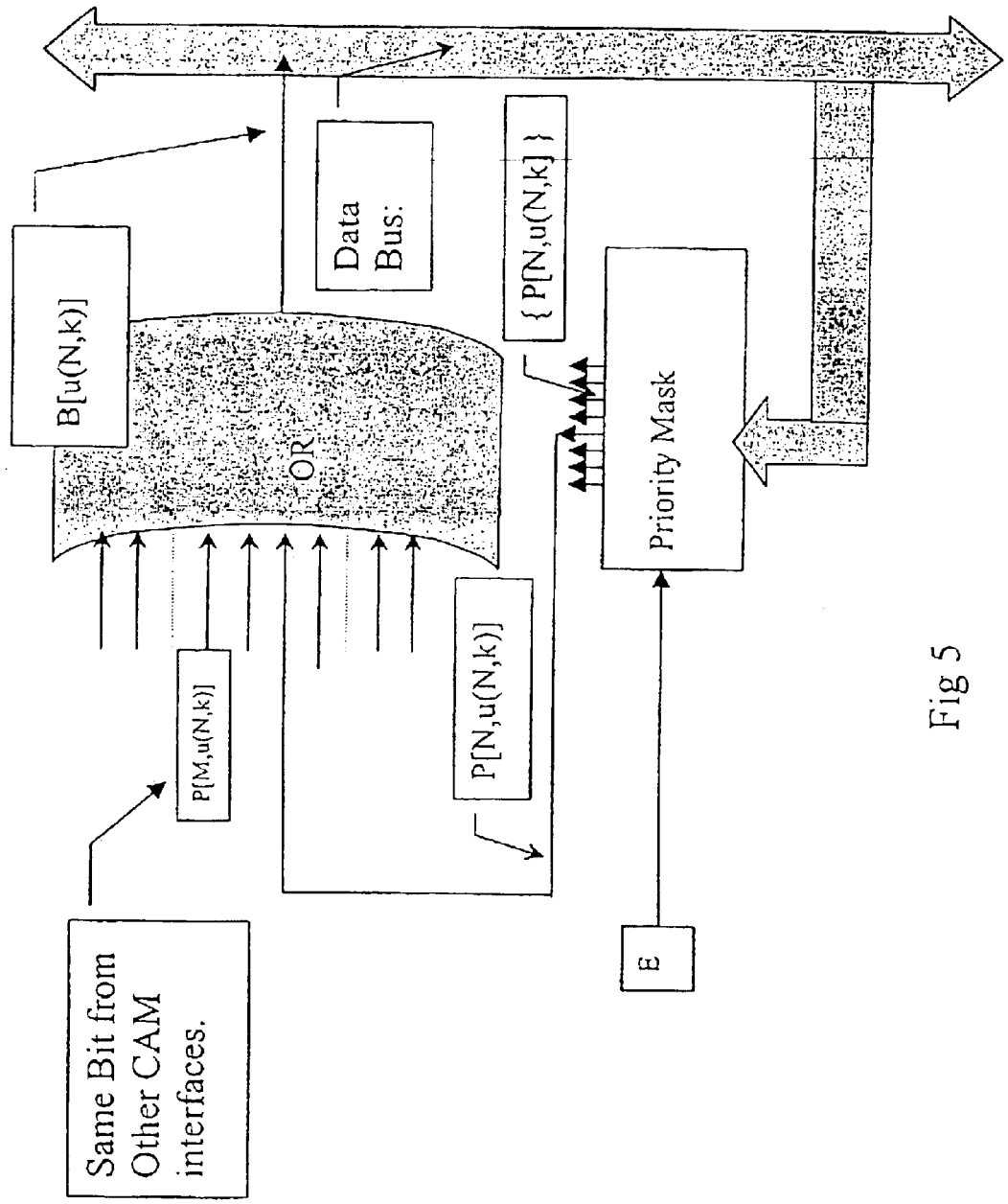
FIG. 5 shows how priority masks are connected in a "OR" function to the Data Bus.

FIG. 5 shows the connection between a Block Priority Mask and the Data Bus. On one side of the Block Priority Mask the Data Bus lines are connected as input while on the other side of the said Block Priority Mask each output line of the Block Priority Mask is connected by a wide "Or" to the Data Bus.

Figure 6:
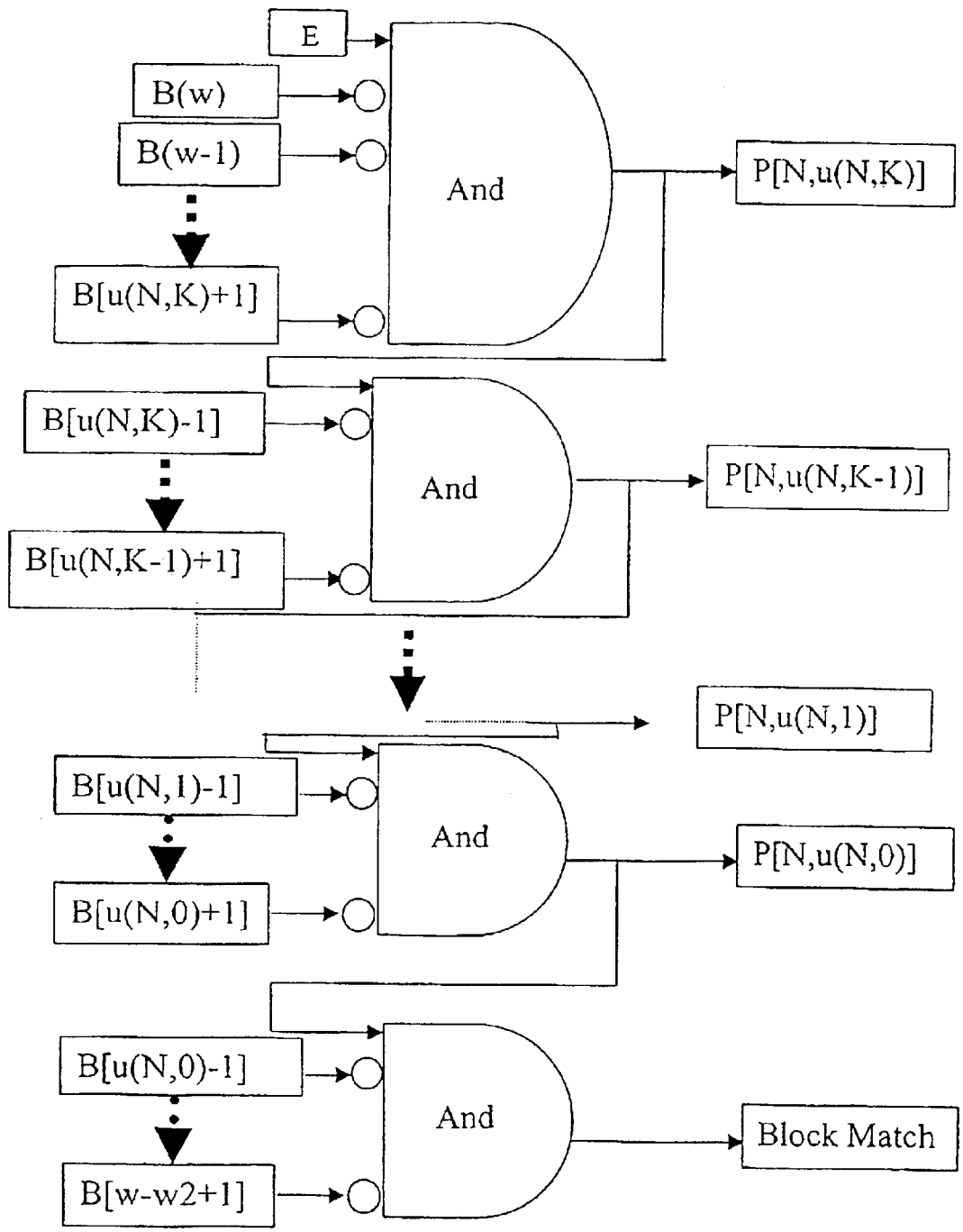
FIG. 6 shows an example of implementation for the Priority Mask.

FIG. 6 shows a preferred embodiment for the priority mask. The Block Address is represented in FIG. 6 in the form:

Block Address:

$$N = \sum_{k=0}^{K} 2^{[u(N,k)]} \quad (1)$$

Where:

K is the number of set bits in the Block Address minus 1.

u(N,k) is the position of the k-th bit in the Block Address, relative to least significant.

For example, to interface a CAM having 16 (4 bits) memory cells into a larger CAM having 256 (8 bits), the Block Address will contain 4 bits.

The Block Address will then have an address containing the 4 most significant bits, then all least significant bits zero:

For example N=1010,0000

The Number of set bits is 2, so K=1

We may write $10100000=1.2^7+1.2^5$

So in this case we have:

U[N,0]=5; U[N,1]=7;

Referring again to FIG. 6, for every set bit of the Block Address, a line P{N,u(N,k)} is output from the Block Priority Mask.

The state of that line is set by a logical gate, and it will be set to Active (Logical 1) if all the following conditions are verified:

a)_At least one cell of the CAM is responding, thus activating the Enabling signal E.

b)_The state of the next line at a more significant bit position is active (logical 1), or if the present line is at the most significant bit.

c)_The state of all Bus lines of bits between the present line bit position and the next line at a more significant bit position is not active.

a Block Match signal is issued if P[N, u(N,O)] is active and the state of all Bus lines at bits of the Block Address of less significant position than P[N, u(N,O)] is not active. In case there are no such lines, then the Block Match line will be activated by P[N, u(N,O)] directly.

Where the Block Priority Mask does not have any P(k) lines, (Block Address=0), then the Block Match signal 1 output when the enable signal is activated.

The purpose of this logical circuit is to Mask, i.e. not to set, a bit of the Data Bus if it would change the partial address already set on more significant bits of the Data Bus.

This example shows a particular implementation, but obviously many implementations of the Priority Mask are possible, all having the same principle according to which the line P[N,u(N,k)] is masked (i.e. maintained inactive), if one or more lines of more significant bits of the Data Bus are active, at positions where the Block Address has unset bits.

What is claimed is:

1. A CAM interface that enables the integration of two or more CAM devices into a composite CAM array by connecting the CAM devices to the same Data bus lines and to the same Address bus lines, comprising:
   a) a plurality Wa of lines connecting the CAM interface to a number of Address bus lines and a plurality of Wb lines connecting the CAM interface to the CAM device wherein Wa is larger or equal to Wb;
   b) a first buffer for selectively connecting a first plurality Da of Data lines of the CAM to the same number of Data lines of the Data bus, the connection being done when a first enabling signal is set;
   c) a second buffer for selectively connecting a second plurality Db of data lines of the CAM to a second number of data lines of the data bus, the said second number of Data lines being equal to Db, the said connection being done when a second enabling signal is set;
   d) and a Priority Mask Circuit that receives as input a plurality W2 of Select Lines, the states of which define a Block Address for the CAM interface and also receives as input an enabling signal, the said Priority Mask circuit being further connected to a Data Bus via a number W3 of Data Lines, W3 being larger or equal to W2
   wherein if a number or at least one of the memory cells within the CAM have stored data verifying a given relationship with the data set on the Address Bus lines, then the CAM selects one of the said number of cells, according to the internal priority order defined for the CAM, and applies the address of that cell on the said first buffer or the CAM applies the address of the single responding cell on the said first buffer,
   the CAM also outputs the said enabling signal to the Block Priority Mask; the Block Priority Mask logic circuit then applies the said Block Address on the said W3 number of Data Bus lines while masking any bit of that address that would interfere with any Address being Higher in a predefined direction that has been set on the said Data Bus lines;
   and in case that no Higher Address was output on the Data Bus, the Block Priority Mask logic circuit outputs the said first enabling signal to the said first buffer, whereupon the selected address is set to the said first number of Data Bus lines.

2. A CAM interface according to claim 1 hereinabove wherein the same bus lines may be alternatively used as address bus lines and data bus lines in accordance with the function requirements of the system.

3. A CAM interface according to claim 1 hereinabove that also comprise a Block Range Circuit for comparing an address set on the Address Bus to the Block Address and enables the CAM only in case that the Block Address is lower or equal in the predefined direction than the address set on the Address Bus.

4. A block priority mask and a block address, the said block address being the address of a CAM memory device within a composite memory array with two or more memory devices interfaced to the same Data bus lines and the same Address bus lines, characterized in that the said block priority mask has one enabling input line, one output line P(k) for every bit set k of the said block address and one block match line wherein the said block priority mask receives as input the said data bus lines and when enabled it performs a logical function that activates each of the said output lines P(k) if and only if no other device on the Data bus has already set a line at a more significant bit position at which the block address has an unset bit and wherein the Block Match line will be activated if
   (a) all P(k) lines are activated and
   (b) there is no other Bus line activated at any bit position of the block address, if that Bus line is at a less significant bit position than the P(k) with the least significant bit position.

5. A block priority mask as claimed in claim 4 hereinabove wherein according to the said logical function the state of P(k) is set to Active (Logical 1) if all the following conditions are verified:
   a) at least one cell of the CAM is responding, thus activating an Enabling signal;
   b) the state of the next line at a more significant bit position is active (logical 1), or the present line is at the most significant bit position;
   c) the state of all Bus lines of bits between the present line bit position and the next line at a more significant bit position is not active.

6. A Block Priority mask with a logical circuit as claimed in claim 5 hereinabove wherein the Priority Mask does not have any P(k) lines (Block Address=zero) and the Block Match signal is output when all Bus lines at positions of the Block Address are not set.

7. A hierarchical CAM architecture wherein two or more CAMs are integrated into a group and two or more groups are integrated into a composite memory array or two or more composite CAM memory arrays or a composite CAM memory array and a single CAM are integrated into a larger composite CAM memory array characterized in that each of the CAM devices respectively has a CAM interface in which an additional output connection is provided and this output is activated if at least one memory cell of the interfaced CAM is found matching; an OR function is applied to the said output lines of the said CAM units and the said OR function is corrected to the CAM interface that is next and higher in hierarchy whereby this output signal selectively activates the said higher hierarchy interface if at least one cell among all cells interfaced in the said lower hierarchy group of CAMs is matching.

8. A hierarchical architecture for a CAM memory as claimed in claim 7 hereinabove for dividing a large composite CAM memory array into smaller CAM units or groups each of which may be searched separately or left out of a search cycle as necessary.

9. A hierarchical architecture for a CAM memory as claimed in claim 7 hereinabove that is integrated within a distinct device such as a chip.

10. A hierarchical architecture as claimed in claim 7 hereinabove that may be added as a module to a CAM memory comprising the interface of claim 1 in order to enlarge the said CAM memory.

11. A hierarchical architecture as claimed in claim 7 hereinabove in which an origin address for the memory search may be fed into one or more of the CAM units whereby the address that is put out on the bus lines as a result of the search must verify a predefined relationship with the said origin address.

* * * * *

UNITED STATES PATENT AND TRADEMARK OFFICE
CERTIFICATE OF CORRECTION

PATENT NO. : 6,957,299 B2
APPLICATION NO. : 10/240104
DATED : October 18, 2005
INVENTOR(S) : Yves Emmanuel Villaret et al.

It is certified that error appears in the above-identified patent and that said Letters Patent is hereby corrected as shown below:

In the Letters Patent, column 10, line 55 of claim 7:

"function is corrected totthe CAM interface that is next and" should read

--function is connected to the CAM interface that is next and--

Signed and Sealed this

Third Day of July, 2007

JON W. DUDAS
*Director of the United States Patent and Trademark Office*